United States Patent
Kim

(10) Patent No.: US 6,878,601 B1
(45) Date of Patent: Apr. 12, 2005

(54) METHOD FOR FABRICATING A CAPACITOR CONTAINING METASTABLE POLYSILICON

(75) Inventor: Jeong Soo Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/742,138

(22) Filed: Dec. 19, 2003

(30) Foreign Application Priority Data

Oct. 7, 2003 (KR) .................................. 10-2003-0046825

(51) Int. Cl.$^7$ .................................................. H01L 21/20
(52) U.S. Cl. ...................... 438/386; 438/389; 438/532
(58) Field of Search .................................. 438/239, 240, 438/243, 245–7, 386–390, 517, 532

(56) References Cited

U.S. PATENT DOCUMENTS

| | | |
|---|---|---|
| 6,309,975 B1 | 10/2001 | Wu et al. |
| 6,319,788 B1 | 11/2001 | Gruening et al. |
| 6,432,795 B1 | 8/2002 | Lee |
| 6,461,967 B2 | 10/2002 | Wu et al. |
| 6,541,334 B2 | 4/2003 | Luetzen et al. |

*Primary Examiner*—Michael S. Lebentritt
*Assistant Examiner*—Beth E. Owens
(74) *Attorney, Agent, or Firm*—Ladas & Parry LLP

(57) ABSTRACT

Described is a method for fabricating a capacitor of a semiconductor device. The method includes the steps of forming an insulating interlayer including a storage node contact hole on a semiconductor substrate, forming a polysilicon layer on the insulating interlayer including the storage node contact hole, and forming a sacrificial resist layer on the polysilicon layer, thereby filling the storage node contact hole with the sacrificial resist layer. Also, the method includes the steps of selectively removing the sacrificial resist layer in such a manner that the sacrificial resist layer remains only in the storage node contact hole, implanting ions into an upper surface of an exposed upper surface of the polysilicon layer, oxidizing an ion-implanted portion of the polysilicon layer after removing a remaining sacrificial resist layer, growing an MPS layer on a surface of the polysilicon layer after removing an oxidized portion of the polysilicon layer, and forming a dielectric layer and an upper electrode on the polysilicon layer including the MPS layer. It is possible to grow MPS without interference of a carbon component generated during the etch back process, which is performed to form a cylinder capacitor by using storage node polysilicon.

4 Claims, 7 Drawing Sheets

METHOD FOR FABRICATING A CAPACITOR CONTAINING METASTABLE POLYSILICON

BACKGROUND OF THE INVENTION

1. Field of the Invention

The present invention relates to a method for fabricating a capacitor of a semiconductor device, and more particularly to a method for fabricating a capacitor of a semiconductor device capable of forming a cylinder without etching back storage node polysilicon, in order to easily grow MPS (Meta Poly silicon)-affected by a carbon component generated through a storage node polysilicon etch back process, which is performed for forming a cylinder capacity using the storage node polysilicon.

2. Description of the Prior Art

Hereinafter, a conventional method for fabricating a capacitor of a semiconductor device will be briefly described.

FIGS. 1a to 1f are sectional views showing the conventional method for fabricating the capacitor of the semiconductor device.

As shown in FIG. 1a, according to the conventional method for fabricating the capacitor of the semiconductor device, a first insulating interlayer 11 is selectively removed by using a plug contact mask (not shown) after initially depositing the first insulating interlayer 11 on a semiconductor substrate (not shown), thereby forming a plug contact hole (not shown).

Subsequently, after depositing a conductive material layer on the first insulating interlayer 11 including the plug contact hole (not shown), a contact plug 13 is formed in the plug contact hole (not shown) through a total etching process or a CMP (Chemically and Mechanically Polishing) process.

Next, after a second insulating interlayer 15 is deposited on the first insulating interlayer 11 including the contact plug 13, a resist pattern (not shown) is formed on the second insulating interlayer 15 in order to use the resist pattern as a storage node contact mask.

Subsequently, the second insulating interlayer 15 is removed by using the resist pattern (not shown) as a mask, thereby forming a storage contact hole 17.

Thereafter, as shown in FIG. 1b, after removing the resist pattern (not shown), a polysilicon layer 19 for the storage node is deposited on the second insulating interlayer 15 including the storage node contact hole 17. The polysilicon layer 19 is a cylinder layer used as the capacitor.

Next, as shown in FIG. 1c, a photo-sensitive material film 21 is coated on the polysilicon layer 19, thereby filling the storage node contact hole 17 with the photo-sensitive material.

Subsequently, as shown in FIG. 1d, the photo-sensitive material film 21 and the polysilicon layer 19 are selectively removed through the total etching process or the CMP process. At this time, an upper surface of the second insulating interlayer 15 acts as an etch stop point. In this case, the photo-sensitive material film 21 is required remaining only in the storage node contact hole 17.

Subsequently, as shown in FIG. 1e, a photo-sensitive material film 21a remaining in the storage node contact hole 17 is removed.

Next, as shown in FIG. 1f, an MPS layer 23 is grown on a surface of the polysilicon layer 19a.

Subsequently, a dielectric layer (not shown) and an upper electrode (not shown) are sequentially formed on the polysilicon layer 19a including the MPS layer 23, thereby fabricating the capacitor.

However, according to the conventional method for fabricating the capacitor, a carbon component or the likes generated through an etch back process for the polysilicon layer 19a may affect an influence on an MPS growth, which exerts an influence on the capacitance value.

FIG. 2 shows a case in which MPS is abnormally grown due to reasons described above. FIG. 3 shows a result of an etch-back effect in the storage node polysilicon layer, which is achieved by growing MPS after depositing storage node polysilicon without performing the etch back process.

Accordingly, it is understood from FIGS. 2 and 3 that a degree of the MPS growth is varied depending on the etch back process for the storage node polysilicon. In other words, the etch back process for the storage node polysilicon layer, which is performed in order to insulate between cylinders, may interfere the MPS growth. For this reason, the performance of the capacitor is degraded.

SUMMARY OF THE INVENTION

Accordingly, the present invention has been made to solve the above-mentioned problems occurring in the prior art, and an object of the present invention is to provide a method for fabricating a capacitor of a semiconductor device capable of forming a cylinder without etching back storage node polysilicon, in order to easily grow MPS (Meta Poly silicon) affected by a carbon component generated through a storage node polysilicon etch back process, which is performed for forming a cylinder capacity using the storage node polysilicon.

In order to accomplish this object, there is provided a method for fabricating a capacitor of a semiconductor device, the method comprising the steps of forming an insulating interlayer including a storage node contact hole on a semiconductor substrate, forming a polysilicon layer on the insulating interlayer including the storage node contact hole, forming a sacrificial resist layer on the polysilicon layer, thereby filling the storage node contact hole with the sacrificial resist layer, selectively removing the sacrificial resist layer in such a manner that the sacrificial resist layer remains only in the storage node contact hole, implanting ions into an upper surface of an exposed upper surface of the polysilicon layer, oxidizing an ion-implanted portion of the polysilicon layer after removing a remaining sacrificial resist layer, growing an MPS layer on a surface of the polysilicon layer after removing an oxidized portion of the polysilicon layer, and forming a dielectric layer and an upper electrode on the polysilicon layer including the MPS layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
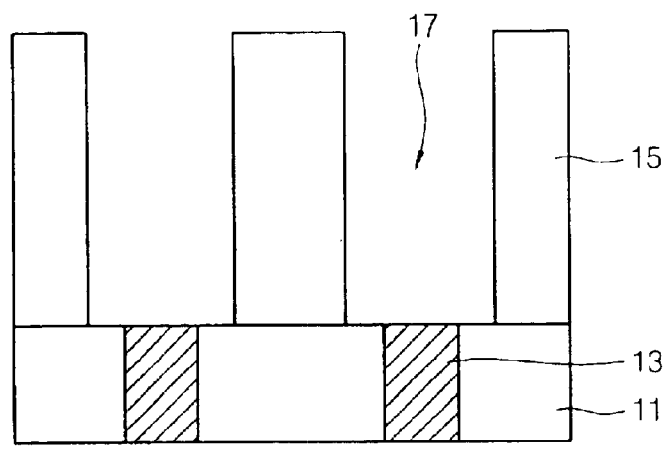
FIGS. 1a to 1f are sectional views showing a conventional method for fabricating a capacitor of a semiconductor device.
Figure 1B:
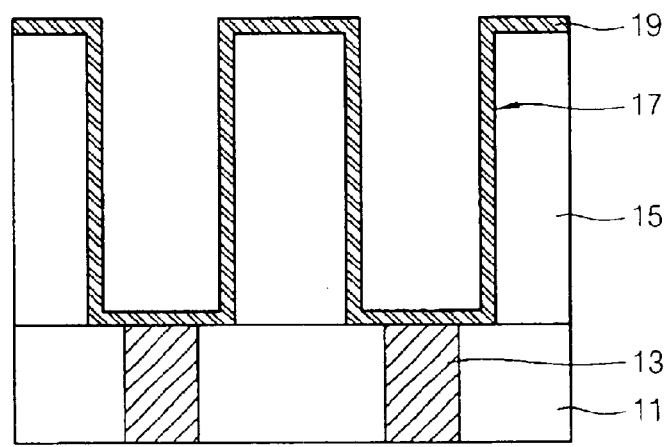
Figure 1C:
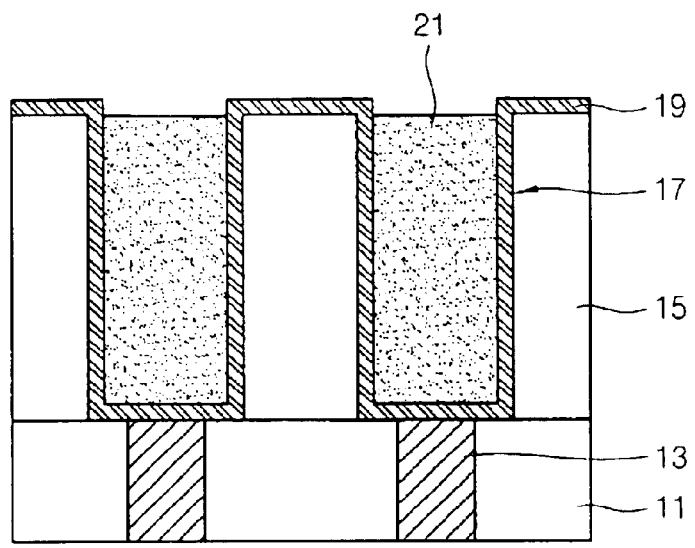
Figure 1D:
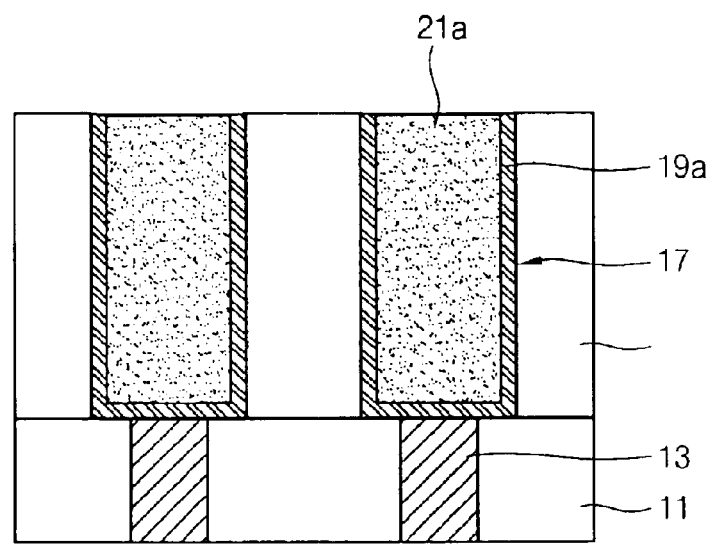
Figure 1E:
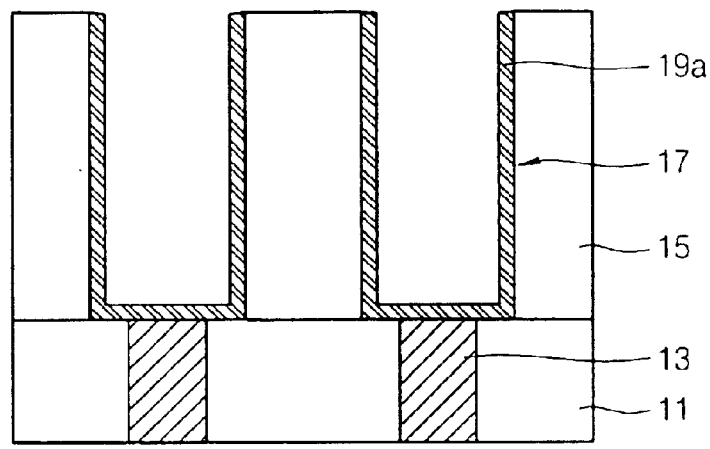
Figure 1F:
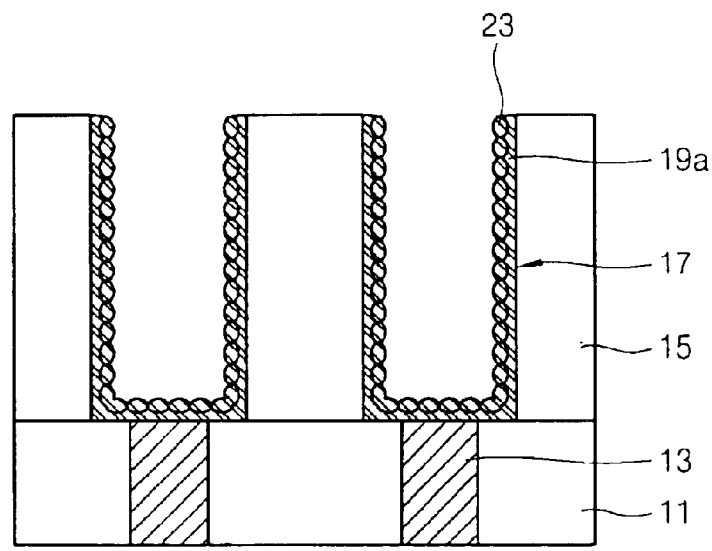
Figure 2:
FIG. 2 is a photograph showing a sectional shape of a capacitor formed through a conventional capacitor fabricating method of a semiconductor device, in which MPS has been grown after an etch back process has been carried out with respect to a polysilicon layer for a storage node.
Figure 3:
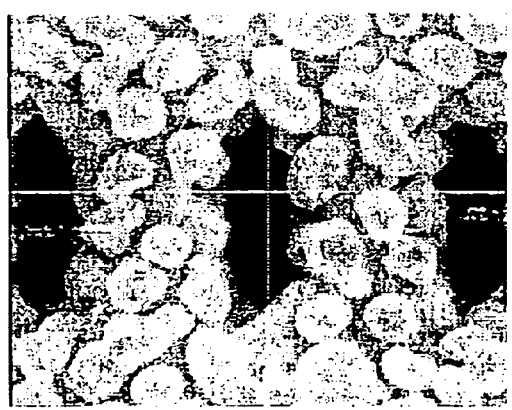
FIG. 3 is a photograph showing a sectional shape of a capacitor formed through a conventional capacitor fabricating method of a semiconductor device, in which MPS has been grown after a polysilicon layer for a storage node has been deposited.

Hereinafter, a method for fabricating of a capacitor of a semiconductor device according to a preferred embodiment of the present invention will be described with reference to the accompanying drawings. In the following description and drawings, the same reference numerals are used to designate the same or similar components, and so repetition of the description on the same or similar components will be omitted.

FIGS. 4a to 4f are sectional views showing the method for fabricating the capacitor of the semiconductor device according to the present invention.

Figure 4A:
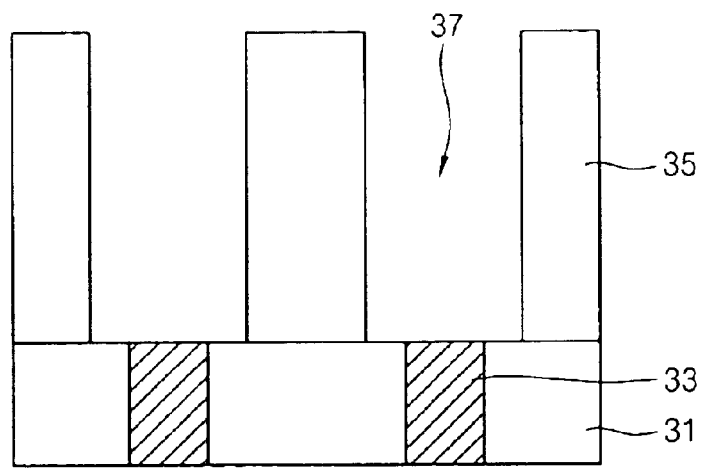
FIGS. 4a to 4f are sectional views showing a method for fabricating a capacitor of a semiconductor device according to the present invention.

As shown in FIG. 4a, according to the method for fabricating the capacitor of the semiconductor device of the present invention, a first insulating interlayer 31 is selectively removed by using a plug contact mask (not shown) after initially depositing the first insulating interlayer 31 on a semiconductor substrate (not shown), thereby forming a plug contact hole (not shown).

Subsequently, a conductive material layer is deposited on the first insulating interlayer 31 including the plug contact hole (not shown), a contact plug 33 is formed in the plug contact hole (not shown) through a total etching process or a CMP (Chemically and Mechanically Polishing) process.

Next, after depositing a second insulating interlayer 35 on the first insulating interlayer 31 including the contact plug 33, a resist pattern (not shown) is formed on the second insulating interlayer 35 in order to use the resist pattern as a storage node contact mask.

Subsequently, the second insulating interlayer 35 is removed by using the resist pattern (not shown) as a mask, thereby forming a storage contact hole 37.

Figure 4B:
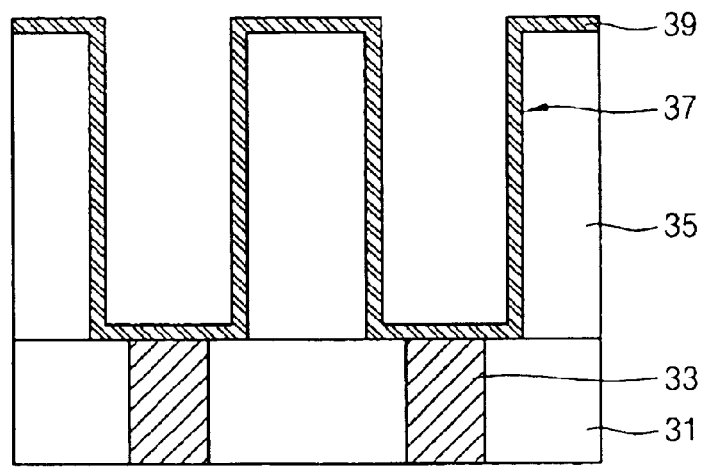

Thereafter, as shown in FIG. 4b, after the resist pattern (not shown) has been removed, a polysilicon layer 39 for the storage node is deposited on the second insulating interlayer 35 including the storage node contact hole 37. The polysilicon layer 39 is a cylinder layer used as the capacitor.

Figure 4C:
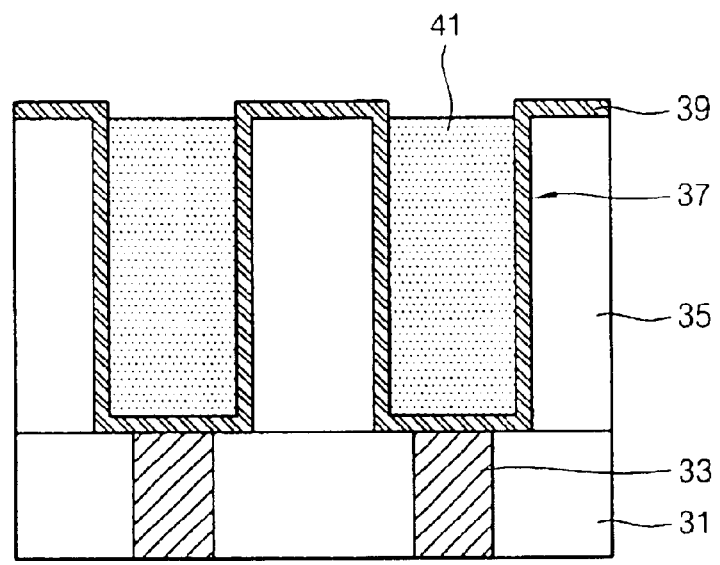

Next, as shown in FIG. 4c, a photo-sensitive material film 41 is coated on the polysilicon layer 39, thereby filling the storage node contact hole 37 with the photosensitive material.

Next, the photo-sensitive material film 41 is etched back in such a manner that the photo-sensitive material film 41 remains only in the storage node contact hole 37.

Figure 4D:
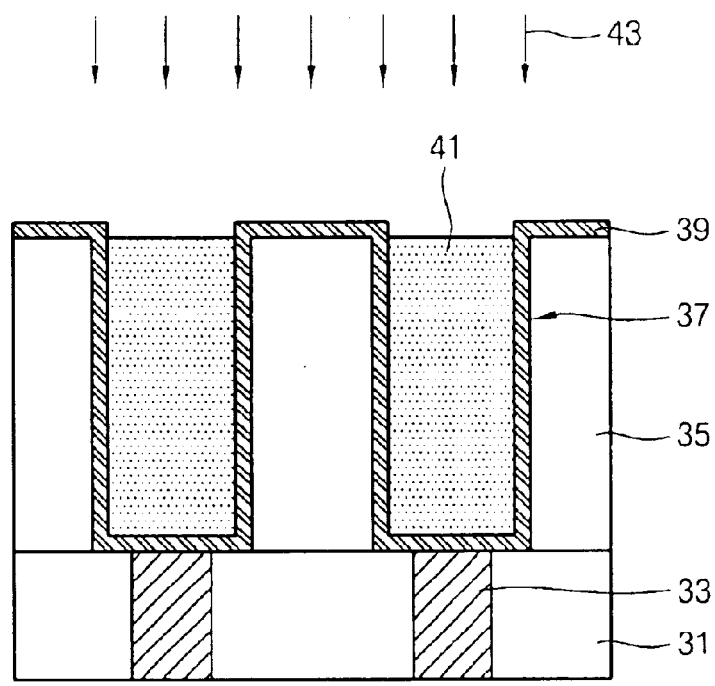

Subsequently, as shown in FIG. 4d, an ion implantation 43 is carried out with respect to an exposed portion of the polysilicon layer 39 by using oxygen $O_2$ and nitrogen $N_2$.

Figure 4E:
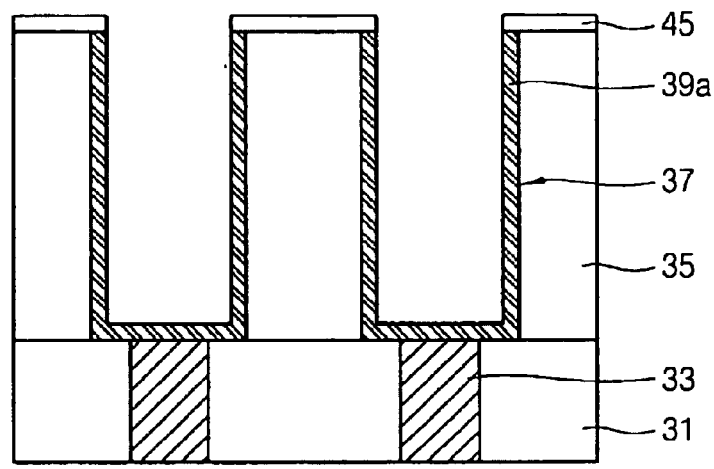

Then, as shown in FIG. 4e, an ion-implanted portion of the polysilicon layer 39 is oxidized after removing a remaining photo-sensitive material film 41, thereby forming an oxide layer 45.

Figure 4F:
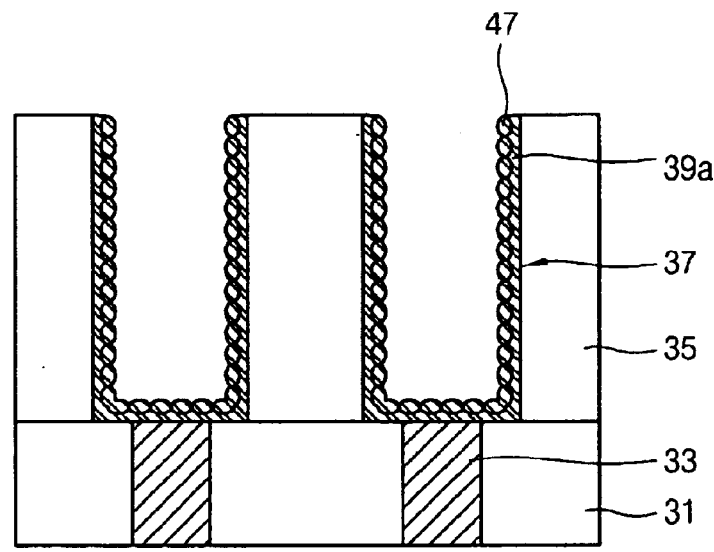

Subsequently, as shown in FIG. 4f, an MPS layer 47 is grown on an exposed surface of the polysilicon layer 39a after a predetermined portion of the oxide layer 45 has been removed through a cleaning process.

Then, a dielectric layer (not shown) and an upper electrode (not shown) are sequentially formed on the polysilicon layer 39a including the MPS layer 47, thereby fabricating the capacitor.

As described above, in the method for fabricating the capacitor of the semiconductor device according to the present invention, since it is possible to grow MPS without interference of a carbon component generated during the etch back process for the storage node polysilicon layer, the superior MPS growth may be guaranteed. As a result, a stable capacitance value can be ensured.

Due to the stable capacitance value, a refresh characteristic of the capacitor can be improved, so that a yield rate for the capacitor increases.

Since the yield rate for the capacitor increases, manufacturing cost for the capacitor can be reduced, so price competitiveness may be guaranteed.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device, the method comprising the steps of:
   i) forming an insulating interlayer including a storage node contact hole on a semiconductor substrate;
   ii) forming a polysilicon layer on the insulating interlayer including the storage node contact hole;
   iii) forming a sacrificial resist layer on the polysilicon layer, thereby filling the storage node contact hole with the sacrificial resist layer;
   iv) selectively removing the sacrificial resist layer in such a manner that the sacrificial resist layer remains only in the storage node contact hole;
   v) implanting ions into the upper surface of an exposed upper surface of the polysilicon layer;
   vi) oxidizing an ion-implanted portion of the polysilicon layer after removing the remaining sacrificial resist layer;
   vii) growing an MPS layer on a surface of the polysilicon layer after removing the oxidized portion of the polysilicon layer; and
   viii) forming a dielectric layer and an upper electrode on the polysilicon layer including the MPS layer.

2. The method as claimed in claim 1, wherein the ions used in step v) include oxygen $O_2$ and nitrogen $N_2$.

3. The method as claimed in claim 1, wherein the sacrificial resist layer is etched through an etch back process in such a manner that the sacrificial resist layer remains only in the storage node contact hole.

4. The method as claimed in claim 1, wherein the oxidized portion of the polysilicon layer is removed through a cleaning process.

* * * * *

UNITED STATES PATENT AND TRADEMARK OFFICE
CERTIFICATE OF CORRECTION

PATENT NO. : 6,878,601 B1  Page 1 of 1
DATED : April 12, 2005
INVENTOR(S) : Jeong Soo Kim It is certified that error appears in the above-identified patent and that said Letters Patent is hereby corrected as shown below:

<u>Title page,</u>
Item [30], Foreign Application Priority Data, delete "Oct. 7, 2003" and insert -- July 10, 2003 --.

Signed and Sealed this

Twenty-eighth Day of March, 2006

JON W. DUDAS
*Director of the United States Patent and Trademark Office*